United States Patent
Brocato

(10) Patent No.: US 10,984,300 B2
(45) Date of Patent: Apr. 20, 2021

(54) DUAL FREQUENCY TRANSCEIVER DEVICE

(71) Applicant: National Technology & Engineering Solutions of Sandia, LLC, Albuquerque, NM (US)

(72) Inventor: Robert W. Brocato, Sandia Park, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 148 days.

(21) Appl. No.: 16/110,442

(22) Filed: Aug. 23, 2018

(65) Prior Publication Data

US 2019/0005369 A1 Jan. 3, 2019

Related U.S. Application Data

(63) Continuation of application No. 15/340,674, filed on Nov. 1, 2016, now Pat. No. 10,235,614.

(51) Int. Cl.
*G06K 19/07* (2006.01)
*G06K 7/10* (2006.01)
(Continued)

(52) U.S. Cl.
CPC ..... *G06K 19/0717* (2013.01); *G06K 7/10138* (2013.01); *G06K 19/0672* (2013.01);
(Continued)

(58) Field of Classification Search
CPC ....... H01L 41/187; H01L 41/39; H01L 27/06; H01L 41/1873; H01L 41/1871;
(Continued)

(56) References Cited

U.S. PATENT DOCUMENTS

| 6,922,059 B2 * | 7/2005 | Zank ..................... G01D 9/005 324/457 |
| 9,460,321 B1 | 10/2016 | Brocato |

(Continued)

OTHER PUBLICATIONS

Schulman, J.N. et al., "W-Band Direct Detection Circuit Performance With Sb-Heterostructure Diodes", IEEE Microwave and Wireless Components Letters, vol. 14, No. 7, Jul. 2004, pp. 316-318.

(Continued)

*Primary Examiner* — Arnold M Kinkead
(74) *Attorney, Agent, or Firm* — Mark A. Dodd

(57) ABSTRACT

A transceiver device for receiving an interrogation signal at a first carrier frequency and for transmitting a response signal at a second carrier frequency is disclosed. The interrogation signal comprises the first carrier frequency modulated at the second carrier frequency. The communication device includes a sensor coupled to a demodulator. The sensor receives a low frequency input used to further modulate the interrogation signal. The demodulator demodulates the low frequency input from the first carrier frequency to thereby generate the response signal comprising the second carrier frequency and the low frequency input. The demodulator preferably includes a pyroelectric demodulator, a piezoelectric demodulator, or a detector diode. The demodulator preferably has a frequency response less than the first carrier frequency but greater than the second carrier frequency.

20 Claims, 7 Drawing Sheets

(51) Int. Cl.
| | |
|---|---|
| *H01L 41/39* | (2013.01) |
| *H01L 41/187* | (2006.01) |
| *H03H 1/00* | (2006.01) |
| *H03D 3/34* | (2006.01) |
| *H03D 1/10* | (2006.01) |
| *H01L 37/02* | (2006.01) |
| *G06K 19/067* | (2006.01) |
| *H03H 9/56* | (2006.01) |
| *H03H 9/64* | (2006.01) |
| *H03D 1/00* | (2006.01) |
| *H04L 27/06* | (2006.01) |

(52) U.S. Cl.
CPC ..... *G06K 19/0716* (2013.01); *G06K 19/0723* (2013.01); *H01L 37/02* (2013.01); *H01L 41/187* (2013.01); *H01L 41/1871* (2013.01); *H01L 41/1873* (2013.01); *H01L 41/1876* (2013.01); *H01L 41/39* (2013.01); *H03D 1/00* (2013.01); *H03D 1/10* (2013.01); *H03D 3/34* (2013.01); *H03H 1/0007* (2013.01); *H03H 9/56* (2013.01); *H03H 9/64* (2013.01); *H04L 27/06* (2013.01)

(58) Field of Classification Search
CPC ........ H01L 37/02; H01L 41/1876; G01J 5/34; G06K 19/0672; G06K 19/0717; G06K 19/0716; G06K 7/10138; H03D 1/00; H03D 1/10; H03D 3/34; H03H 9/56; H03H 9/64; H03H 1/0007; H04L 27/06
USPC .......... 250/208.2, 214 A; 600/476; 370/205; 375/341; 340/601, 602, 626.58; 329/315, 328
See application file for complete search history.

(56) References Cited

U.S. PATENT DOCUMENTS

| | | | | |
|---|---|---|---|---|
| 2006/0202802 | A1* | 9/2006 | Seppa | G06K 7/10079 340/10.3 |
| 2008/0061959 | A1* | 3/2008 | Breed | G01F 23/2962 340/539.1 |
| 2016/0099700 | A1* | 4/2016 | Tavakol | H01F 27/29 343/861 |

OTHER PUBLICATIONS

Brandon, E. J. et al., "Structural health management technologies for inflatable/deployable structures: Integrating sensing and self-healing," Acta Astronautica (2011) 68:883-903.
Brocato, R. W. et al., "Re-configurable Completely Unpowered Wireless Sensors," 2007 Electronic Components and Technology Conference, pp. 179-183.
Brocato, R. W., "Passive Wireless Sensing Tags NASA Inflatable Structures," Sandia Report, SAND2006-1288, Sandia National Laboratories (2006) 20 pages.
Brocato, R., "Passive Wireless Sensors," Sandia National Laboratories, SAND2007-1872C, 15 pages.
Poh, A., "A Review of Wireless SAW Sensors," IEEE Transactions on Ultrasonics, Ferroelectrics, and Frequency Control (2000) 47(2):317-332.
Reindl, L. M. et al., "SAW-Based Radio Sensor Systems," IEEE Sensors Journal (2001) 1(1):69-78.
Steindl, R. et al., "Impedance Loaded SAW Sensors Offer a Wide Range of Measurement Opportunities," IEEE Transactions on Microwave Theory and Techniques (1999) 47(12):2625-2629.

* cited by examiner

| Impedance Varying Sensor type | Application |
|---|---|
| Button mechanical switch | Tactile sensing clothing/gloves |
| Button mechanical switch | Unpowered wireless keyboard |
| Magnetic-actived switch | Piston position sensing |
| Magnetic-actived switch | Door/window sensor |
| Magnetic-actived switch | Engine tachometer |
| Resistance strain gage | Jet turbine blade state-of-health |
| Resistance strain gage | Helicopter rotor state-of-health |
| Resistance strain gage | Well drilling blowout preventer pressure |
| Resistance thermometer | Fluid immersion temperature |
| Resistance thermometer | Well drill-bit temperature |
| Piezo-electric pressure | Space-station micrometeoroid impact sensor |
| Piezo-electric pressure | Heart rate sensor |
| Thermocouple thermometer | Oven temperature |
| Diode impedance | High voltage power line state-of-health |
| Photocell | Remote light sensor |

FIG. 8

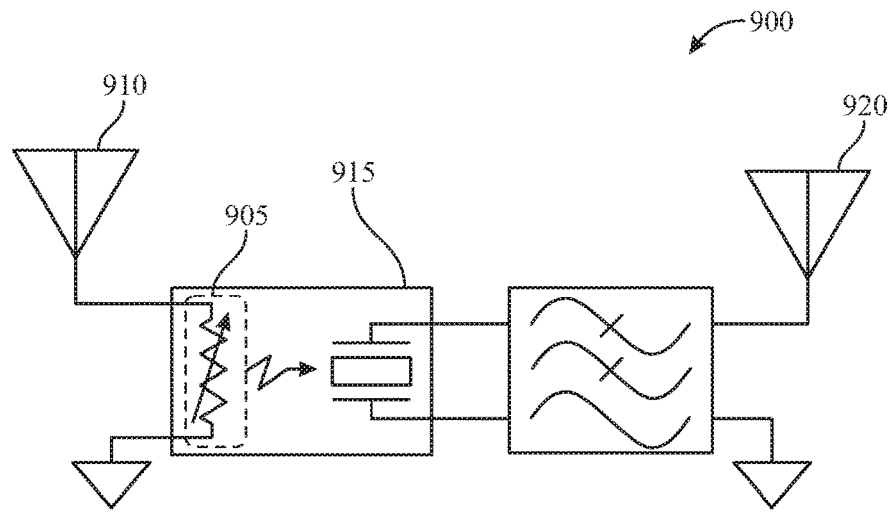

FIG. 9

DUAL FREQUENCY TRANSCEIVER DEVICE

CROSS-REFERENCE TO RELATED APPLICATION

This application is a continuation of the commonly owned U.S. patent application Ser. No. 15/340,674 filed on Nov. 1, 2016, under the title "Communication Device and Method of Making the Same."

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND

Various types of industries use a variety of radio frequency identification (RFID) devices. These RFID devices require the transmission of an interrogation signal from a transmitter, reception from a sensor-tag, and then a re-transmission of a backscatter-modulated response signal from the sensor-tag. Very often, these RFID devices require the interrogation signal and the backscatter-modulated response signal to operate on a same frequency. Since these RFID devices are dependent on using a time-delay between a transmitted signal and a received signal to differentiate between the interrogation signal and the backscatter-modulated response signal, residual reflected signals from a surrounding environment caused by an interrogation pulse can limit performance of the sensor-tag. Some RFID devices use Surface Acoustic Wave (SAW) devices to improve range and sensitivity. This is done by creating a controlled delay in a re-transmission of the received signal to allow for the residual signals in a surrounding to fade away. However, the presence of the residual signals can still potentially limit the performance of any unpowered wireless sensor which must respond on the same frequency that it received, especially if such unpowered wireless sensors are being used in a conductive structure like an airplane wing, an engine, a well pipe, or a ship's hull. In the above locations, reflections of the interrogation signal can persist and can degrade same-frequency reception.

SUMMARY

One aspect of the present description relates to a communication device which includes a sensor coupled to a demodulator, where the demodulator includes a pyroelectric demodulator.

Another aspect of the present description relates to a communication device which includes a sensor coupled to a demodulator, where the demodulator includes a pyroelectric demodulator. Additionally, the pyroelectric demodulator includes a second layer over a silicon substrate, where the second layer comprises silicon. Further, the pyroelectric demodulator includes a third layer over the second layer, where the third layer comprises at least one of zinc oxide or $TiO_x$. Moreover, the pyroelectric demodulator includes a first platinum layer over the third layer. Furthermore, the pyroelectric demodulator includes a fifth layer over the first platinum layer. Additionally, the pyroelectric demodulator includes a seventh layer over the first platinum layer. Moreover, the pyroelectric demodulator includes an eighth layer over the seventh layer. Further, the pyroelectric demodulator includes a third platinum layer over the eighth layer. Furthermore, the pyroelectric demodulator includes an eleventh layer over the third platinum layer.

Still another aspect of the present disclosure relates to a communication device which includes a sensor coupled to a demodulator, where the demodulator includes a microwave detector diode.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

FIG. 8 is a table which lists various non-limiting impedance varying sensor types and the respective applications, in accordance with one or more embodiments.

FIG. 9 is a schematic view of a communication device 900 in accordance with one or more embodiments.

DETAILED DESCRIPTION

The following disclosure provides many different embodiments, or examples, for implementing different features of the present application. Specific examples of components and arrangements are described below to simplify the present disclosure. These are examples and are not intended to be limiting. The making and using of illustrative embodiments are discussed in detail below. It should be appreciated, however, that the disclosure provides many applicable concepts that can be embodied in a wide variety of specific contexts. In at least some embodiments, one or more embodiment(s) detailed herein and/or variations thereof are combinable with one or more embodiment(s) herein and/or variations thereof.

By transmitting a response signal at a frequency that is distinct from the frequency of an interrogation signal, a sensor-tag of an RFID device improves working range and sensitivity of a communication link. Various embodiments of the present disclosure relate to the RFID device which is capable of wirelessly measuring physical attributes such as position, pressure, temperature, velocity, sugar content, heart rate, blood oxygen, humidity, acceleration, etc. via the interrogation signal. According to one or more embodiments, the RFID device uses no active sources of power except for the power within the interrogation signal. In various embodiments, the RFID device's response is on a user selectable frequency that is not a harmonic frequency of the interrogation signal. In one or more embodiments, the above separation in frequency between the interrogation signal and the response signal provides improvement for measuring physical parameters in a radio reflective environment where reflections can hinder the performance of the RFID device.

Figure 1:
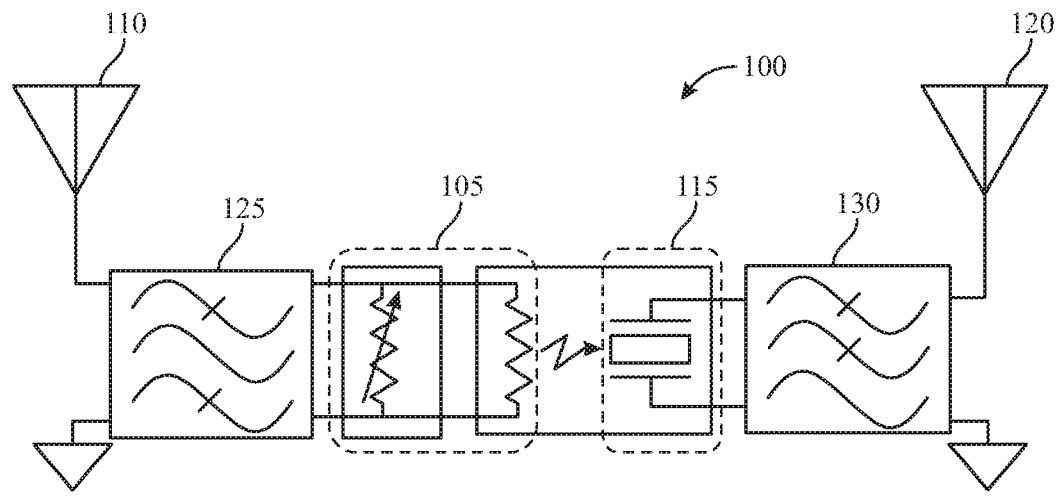
FIG. 1 is a schematic view of a communication device 100 in accordance with one or more embodiments.

FIG. 1 is a schematic view of a communication device 100 in accordance with one or more embodiments. Communication device 100 includes a sensor 105 coupled to an input antenna 110. Sensor 105 is coupled to a demodulator 115. Demodulator 115 is then coupled to an output antenna 120. In at least one embodiment, a band-pass filter 125 is coupled to input antenna 110 and sensor 105. In various embodiments, band-pass filter 125 removes vestiges of an input signal and/or limits a response of communication device 100 to a desired frequency. In one or more embodiments, a low-pass filter 130 is coupled to output antenna 120 and demodulator 115. In various embodiments, low-pass filter 130 filters out some portion of the higher carrier frequency that potentially leak through demodulator 115. In at least one embodiment, the input signal includes the higher carrier frequency modulated with a lower frequency signal which will serve as a carrier for an output signal of communication device 100. In some embodiments, dimensions of band-pass filter 125 range from approximately 10 microns×10 microns to 60 microns×10 microns. In some embodiments, dimensions of low-pass filter 130 range from approximately 10 microns×10 microns to 60 microns×10 microns. In various embodiments, communication device 100 is an RFID tag. In some embodiments, the RFID tag is passive, whereas in other embodiments the RFID tag is active. A total volume of the RFID tag is under 1 mm×1 mm×1 mm, according to at least one embodiment.

Sensor 105 includes an impedance varying sensor. In various embodiments, sensor 105 measures a physical attribute of a mark (i.e. a physical object or a system of interest) through inducing changes in impedance of a sensor element caused when sensor 105 interacts with the mark. In some embodiments, the physical attributes include position, pressure, temperature, velocity, sugar content, heart rate, blood oxygen, humidity, acceleration, etc. In operation, changes in the impedance take place while the input signal is being transmitted through sensor 105. Such changes in impedance constitute relatively low-frequency modulations that are additionally modulated onto the input signal, according to at least one embodiment. In at least one embodiment, sensor 105 includes the impedance varying sensor connected, in series or in parallel to, a resistor. The resistor, in various embodiments, has a fixed impedance which is also modulated into the input signal as a reference parameter.

Demodulator 115 demodulates the additionally modulated input signal from sensor 105 relative to the higher carrier frequency of the input signal so as to filter out the higher carrier frequency. In some embodiments, demodulator 115 includes a pyroelectric demodulator. In some embodiments, demodulator 115 includes a piezoelectric demodulator. In one or more embodiments, demodulator 115 includes a detector diode. Pyroelectric and/or piezoelectric demodulators can generally match impedances to a resistive input over a wider bandwidth than detector diodes. For example, the pyroelectric and/or piezoelectric demodulator has an input bandwidth that extends to much higher and lower frequencies than the detector diodes; and the pyroelectric and/or piezoelectric demodulator has a modulation bandwidth that is typically wider than most of the detector diodes. In some embodiments, the pyroelectric and/or piezoelectric demodulator comprises lead zirconate titanate (PZT). In some embodiments, the pyroelectric and/or piezoelectric demodulator comprises lead lanthanum zirconate titanate (PLZT). In some embodiments, the pyroelectric and/or piezoelectric demodulator comprises triglycine sulfate (TGS). In some embodiments, the pyroelectric and/or piezoelectric demodulator comprises lithium tantalate (LiTaO3). In some embodiments, the pyroelectric and/or piezoelectric demodulator comprises lithium niobate (LiNbO3). In some embodiments, the pyroelectric and/or piezoelectric demodulator comprises gallium nitride (GaN). In some embodiments, the pyroelectric and/or piezoelectric demodulator comprises barium titanate (BaTiO3).

The principle of operation of example pyroelectric and/or piezoelectric demodulators is briefly described as follows. In operation, a transmission of the modulated input signal to the pyroelectric and/or piezoelectric demodulator results in rapidly heating and cooling a pyroelectric and/or piezoelectric element in the pyroelectric and/or piezoelectric demodulator, according to various embodiments. In one or more embodiments, this causes the pyroelectric and/or piezoelectric element to output a voltage at the modulation frequency of the input signal, if the carrier frequency of the input signal is at a higher rate than a thermal time constant of the pyroelectric and/or piezoelectric demodulator and if the modulation frequency of the input signal is at a slower rate than the thermal time constant of the pyroelectric and/or piezoelectric demodulator. Consequently, an output of the pyroelectric and/or piezoelectric demodulator is equal to the modulation frequency of the input signal and its voltage is determined by the voltage responsivity of communication device 100, according to at least one embodiment. This produces an amplitude modulation to a demodulated output signal from demodulator 115, according to various embodiments.

In at least one embodiment, a microwave detector is used as demodulator 115 due to its commercial availability. The microwave detector diode is in physical contact with sensor 105, according to at least one embodiment. Demodulator 115 includes an HP8473D planar doped barrier detector, according to one or more embodiments. In some embodiments, demodulator 115 includes a HSMS2852 zero-biased detector. In some embodiments, demodulator 115 includes a zero-bias Schottky diode.

In operation, the RFID tag wirelessly receives an interrogation signal, measures a physical attribute, and then re-transmits a response signal at a different frequency. The response signal varies in amplitude according to the physical attribute measured by sensor 105, which produces a relatively low-frequency output modulation (typically much lower than the input signal frequency and the output signal frequency) that carries information about a measurement. Separating receive and transmit frequencies prevents the re-transmitted signal from being overpowered by the much stronger originally transmitted signal. The wide separation that is achieved between input and output frequencies allows a reception of a weak return signal while simultaneously sending a strong transmitted signal.

The input signal that functions as the interrogation signal includes a carrier frequency that is amplitude modulated by a return carrier and received by input antenna 110. Sensor 105 adds additional amplitude modulation (i.e. the relatively low frequency output modulation) which includes the physical attributes to the amplitude modulated carrier frequency.

In one or more embodiments, demodulator 115 demodulates the signal coming from sensor 105 so that the carrier frequency is filtered out. The demodulated signal which includes the relatively low frequency output modulation is then transmitted out from output antenna 120 with the modulation frequency of the input signal serving as the return carrier frequency. In one or more embodiments, the additional amplitude modulation frequency is in a radio frequency range. In at least one embodiment, the interrogation signal is transmitted to the RFID tag by any communication device such as a cell phone, a device with Bluetooth, a signal transmitting device, a computer, a laptop etc.

Figure 2:
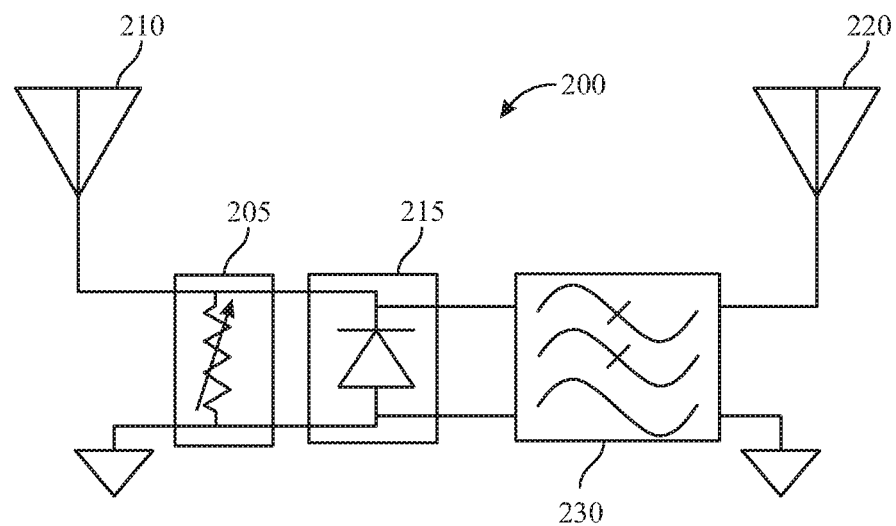
FIG. 2 is a schematic view of a communication device 200 in accordance with one or more embodiments.

FIG. 2 is a schematic view of a communication device 200 in accordance with one or more embodiments. Communication device 200 is similar to communication device 100 (FIG. 1). Communication device 200 includes a sensor 205 coupled to an input antenna 210. Sensor 205 is coupled to a demodulator 215. Demodulator 215 is then coupled to an output antenna 220. Unlike FIG. 1, demodulator 215 includes a microwave detector diode.

Figure 3:
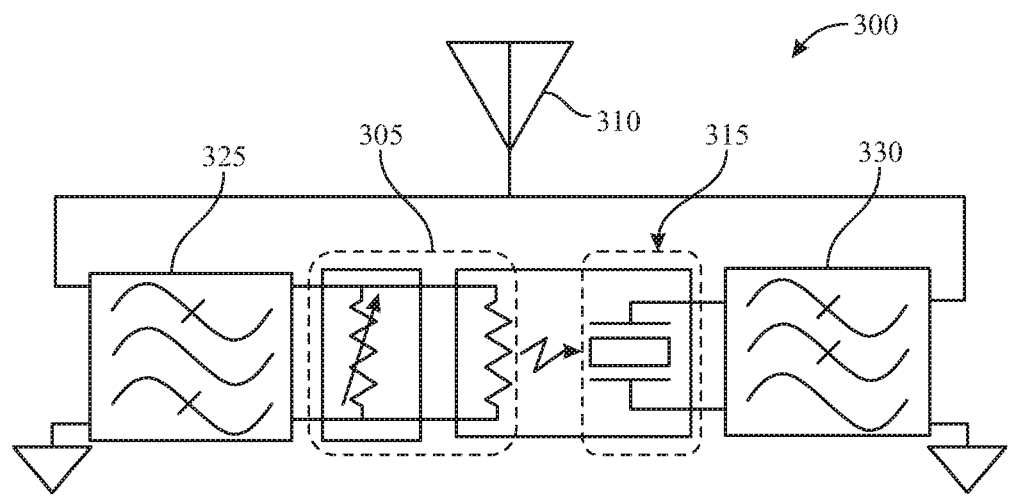
FIG. 3 is a schematic view of a communication device 300 in accordance with one or more embodiments.

FIG. 3 is a schematic view of a communication device 300 in accordance with one or more embodiments. Communication device 300 is similar to communication device 100 (FIG. 1). Unlike FIG. 1, communication device 300 includes a sensor 305 and a demodulator 315 coupled to an antenna 310. In at least one embodiment, demodulator 315 includes a pyroelectric and/or piezoelectric demodulator.

Figure 4:
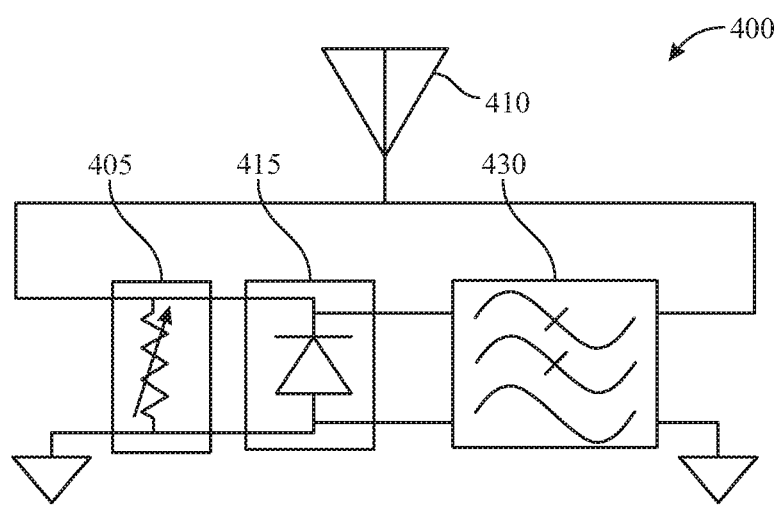
FIG. 4 is a schematic view of a communication device 400 in accordance with one or more embodiments.

FIG. 4 is a schematic view of a communication device 400 in accordance with one or more embodiments. Communication device 400 is similar to communication device 100 (FIG. 1). Unlike FIG. 1, communication device 400 includes a sensor 405 and a demodulator 415 coupled to an antenna 410. In at least one embodiment, demodulator 415 includes a microwave detector diode.

Figure 5:
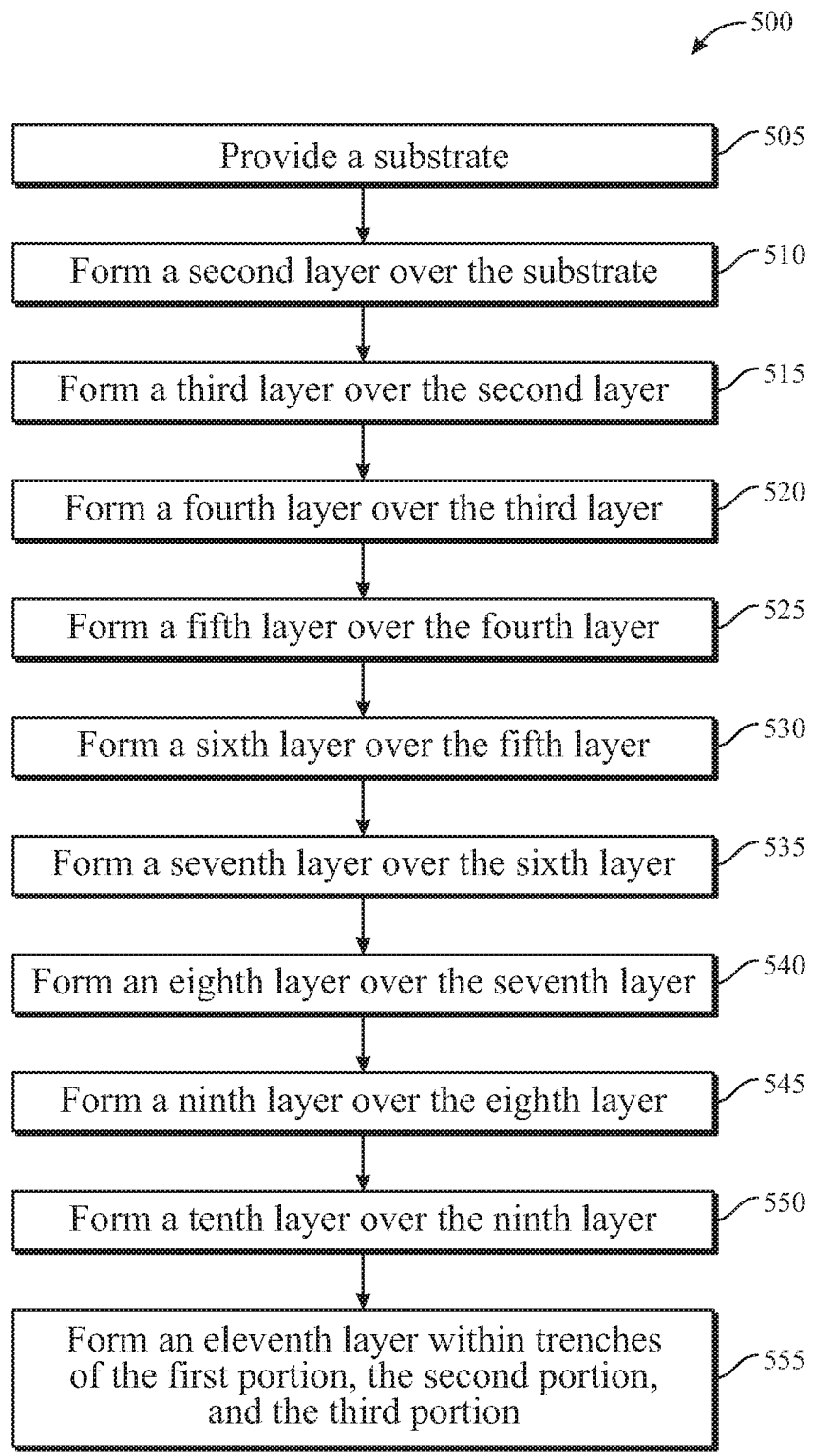
FIG. 5 is a flow chart of a method of making a pyroelectric demodulator in accordance with one or more embodiments.
Figure 6:
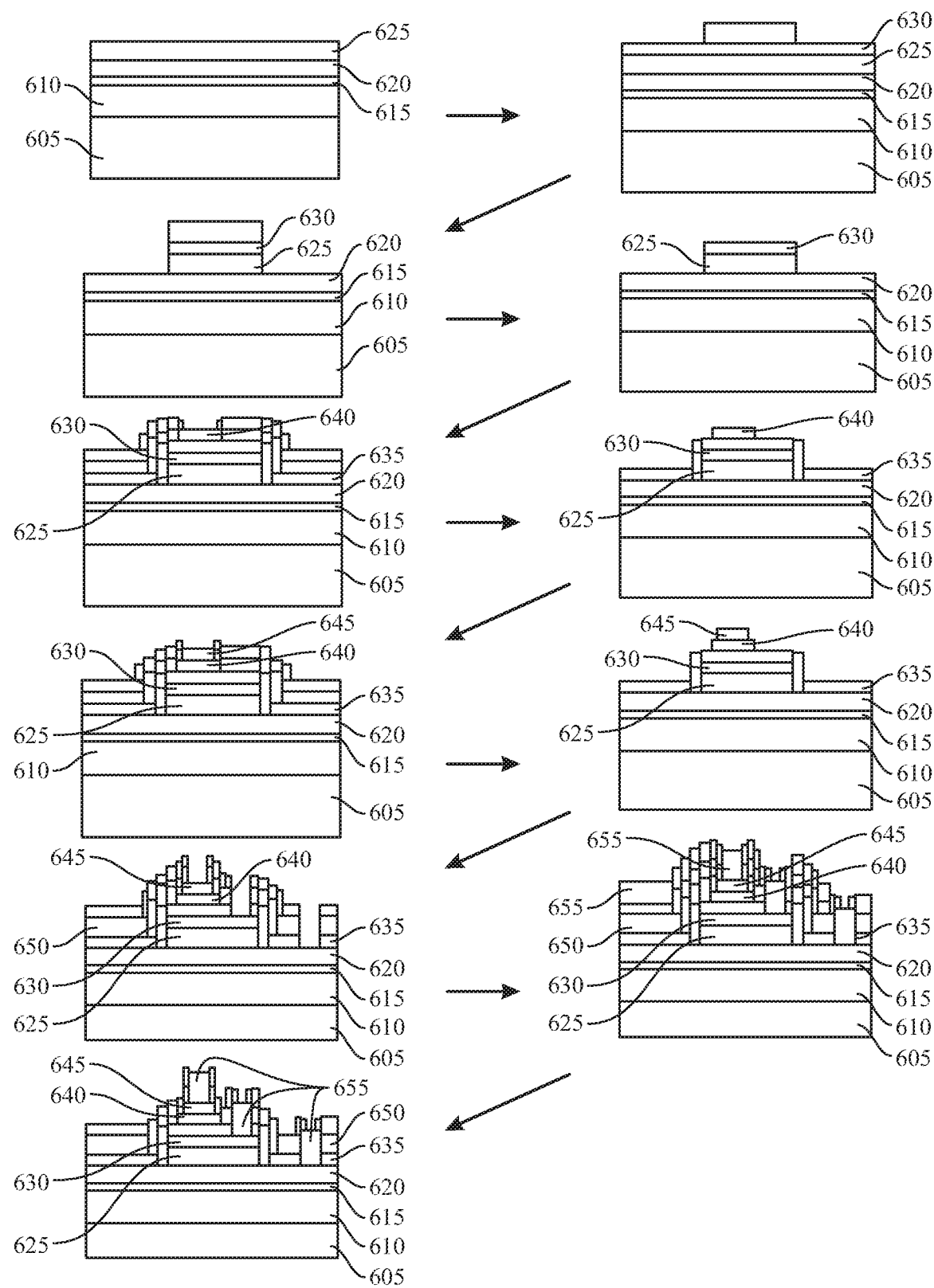
FIG. 6 illustrates a simplified cross-section view of a pyroelectric demodulator at various steps during manufacturing, in accordance with one or more embodiments

FIG. 5 is a flow chart of a method of making a pyroelectric demodulator in accordance with one or more embodiments. Operations of method 500 are intended to complement FIG. 6, which illustrates a simplified cross-section view of a pyroelectric demodulator at various steps during manufacturing, in accordance with one or more embodiments. Method 500 begins with operation 505 in which a substrate, e.g. substrate 605 in FIG. 6, is provided. In at least one embodiment, the substrate comprises silicon. In at least one embodiment, the substrate is a first layer.

In operation 510, a second layer, e.g. second layer 610 in FIG. 6, is formed over the substrate. In at least one embodiment, the second layer is formed using a metalorganic chemical vapor deposition (MOCVD) process, a sputtering process, thermal deposition process, or a spin coating process. In some embodiments, the second layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the second layer over the substrate. In at least one embodiment, the second layer comprises at least one of silicon or silicon dioxide. A thickness of the second layer is 4000 Angstroms (Å), according to one or more embodiments. In various embodiments, a wafer comprising silicon and silicon dioxide is purchased.

In operation 515, a third layer, e.g. third layer 615 in FIG. 6, is formed over the second layer. In at least one embodiment, the third layer is formed using a metalorganic chemical vapor deposition (MOCVD) process, a sputtering process, thermal deposition process, or a spin coating process. In some embodiments, the third layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the third layer over the substrate. In at least one embodiment, the third layer comprises zinc oxide or $TiO_x$. A thickness of the third layer is 500 Angstroms (Å), according to one or more embodiments. In some embodiments, $TiO_x$ is deposited over zinc oxide. In various embodiments, $TiO_x$ is used to overcome delamination when using zinc oxide.

In operation 520, a fourth layer, e.g. fourth layer 620 in FIG. 6, is formed over the third layer. In at least one embodiment, the fourth layer is formed using a metalorganic chemical vapor deposition (MOCVD) process, a sputtering process, thermal deposition process, or a spin coating process. In some embodiments, the fourth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the fourth layer over the substrate. In at least one embodiment, the fourth layer comprises platinum. A thickness of the fourth layer is 3000 Angstroms (Å), according to one or more embodiments.

In operation 525, a fifth layer, e.g. fifth layer 625 in FIG. 6, is formed over the fourth layer. In at least one embodiment, the fifth layer is formed using a metalorganic chemical vapor deposition (MOCVD) process, a sputtering process, thermal deposition process, or a spin coating process. In some embodiments, the fifth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the fifth layer over the substrate. In at least one embodiment, the fifth layer comprises lead zirconate titanate (PZT) or lead lanthanum zirconate titanate (PLZT). A thickness of the fifth layer is 3000 Angstroms (Å), according to one or more embodiments. In some embodiments, the fifth layer comprises at least one of triglycine sulfate (TGS), lithium tantalate (LiTaO3), lithium niobate (LiNbO3), gallium nitride (GaN), or barium titanate (BaTiO3).

In operation 530, a sixth layer, e.g. sixth layer 630 in FIG. 6, is formed over the fifth layer. In at least one embodiment, the sixth layer is formed using a metalorganic chemical vapor deposition (MOCVD) process, a sputtering process, thermal deposition process, or a spin coating process. In some embodiments, the sixth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the sixth layer over the substrate. In at least one embodiment, the sixth layer comprises platinum. A thickness of the sixth layer is 1000 Angstroms (Å), according to one or more embodiments. In various embodiments, the fifth layer and the sixth layer create an island over the fourth layer. In some embodiments, patterning a portion of the sixth layer and then performing reactive ion etching is a methodology used to create the island. In at least one embodiment, a resultant structure after the formation of the island undergoes rapid thermal annealing for approximately 120 seconds.

In operation 535, a seventh layer, e.g. seventh layer 635 in FIG. 6, is formed over the sixth layer. In at least one embodiment, the seventh layer is formed using a metalorganic chemical vapor deposition (MOCVD) process, a sputtering process, thermal deposition process, or a spin coating process. In some embodiments, the seventh layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the seventh layer over the substrate. In at least one embodiment, the seventh layer comprises at least one of silicon or silicon dioxide. A thickness of the seventh layer is 1000 Angstroms (Å), according to one or more embodiments. In various embodiments, the seventh layer is over sidewalls of the island and the fourth layer.

In operation 540, an eighth layer, e.g. eighth layer 640 in FIG. 6, is formed over the seventh layer. In at least one embodiment, the eighth layer is formed using a metalorganic chemical vapor deposition (MOCVD) process, a sputtering process, thermal deposition process, or a spin coating process. In some embodiments, the eighth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the eighth layer over the substrate. In at least one embodiment, the eighth layer comprises at least one of tantalum or tantalum nitride. In various embodiments, the eighth layer is over a portion of the island.

In operation 545, a ninth layer, e.g. ninth layer 645 in FIG. 6, is formed over the eighth layer. In at least one embodiment, the ninth layer is formed using a metalorganic chemical vapor deposition (MOCVD) process, a sputtering process, thermal deposition process, or a spin coating process. In some embodiments, the ninth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the ninth layer over the substrate. In at least one embodiment, the ninth layer comprises platinum. In various embodiments, the ninth layer is over a portion of the eighth layer.

In operation 550, a tenth layer, e.g. tenth layer 650 in FIG. 6, is formed over the ninth layer. In at least one embodiment, the tenth layer is formed using a metalorganic chemical vapor deposition (MOCVD) process, a sputtering process, thermal deposition process, or a spin coating process. In some embodiments, the tenth layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the tenth layer over the substrate. In at least one embodiment, the tenth layer comprises at least one of silicon or silicon dioxide. A thickness of the tenth layer is 2500 Angstroms (Å), according to one or more embodiments. In various embodiments, the tenth layer is over at least a portion of the seventh layer, the eighth layer, and at least a portion of the ninth layer. In at least one embodiment, an etchant (for example hydrogen fluoride) is used to etch out a first portion of the seventh layer and the tenth layer of the island, and a second portion of the seventh layer and the tenth layer between a sidewall of the island and a termini of the pyroelectric demodulator. In one or more embodiments, the etchant is used to etch out a third portion of the tenth layer over the ninth layer.

In operation 555, an eleventh layer, e.g. eleventh layer 655 in FIG. 6, is formed within trenches of the first portion, the second portion, and the third portion. In at least one embodiment, the eleventh layer is formed using a metalorganic chemical vapor deposition (MOCVD) process, a sputtering process, thermal deposition process, or a spin coating process. In some embodiments, the eleventh layer is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the eleventh layer over the substrate. In at least one embodiment, the eleventh layer comprises at least one of gold (Au), nickel (Ni), or titanium (Ti). A thickness of the gold is 5000 Angstroms (Å), according to some embodiments. A thickness of the nickel is 300 Angstroms (Å), according to some embodiments. A thickness of the titanium is 200 Angstroms (Å), according to some embodiments. In at least one embodiment, an uppermost layer of the eleventh layer comprises titanium, followed by nickel, and then followed by gold.

One of ordinary skill in the art would recognize that operations are added or removed from method 500, in one or more embodiments. One of ordinary skill in the art would also recognize that an order of operations in method 500 is able to be changed, in some embodiments.

Figure 7A:
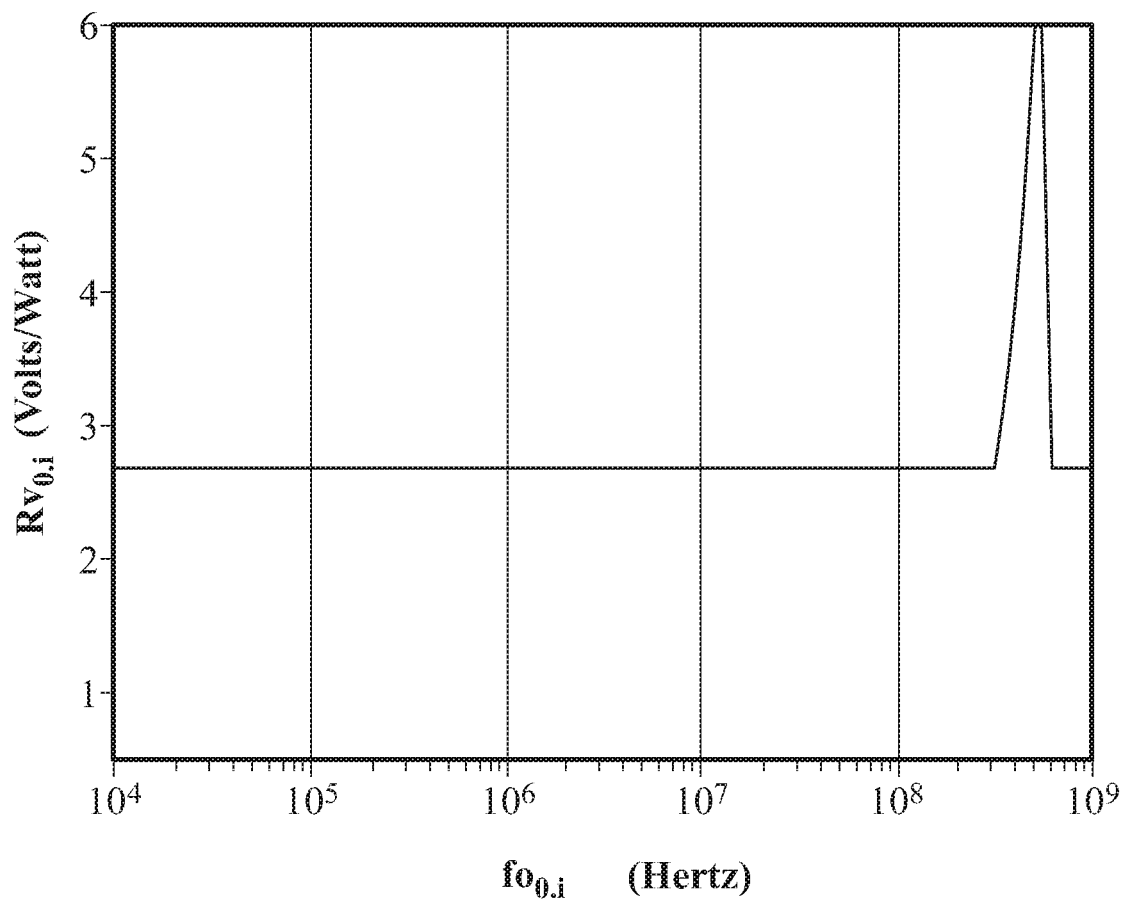
FIGS. 7a and 7b are graphs which illustrate voltage responsivity of lead lanthanum zirconate titanate (PLZT) pyroelectric demodulators, in accordance with one or more embodiments.
Figure 7B:
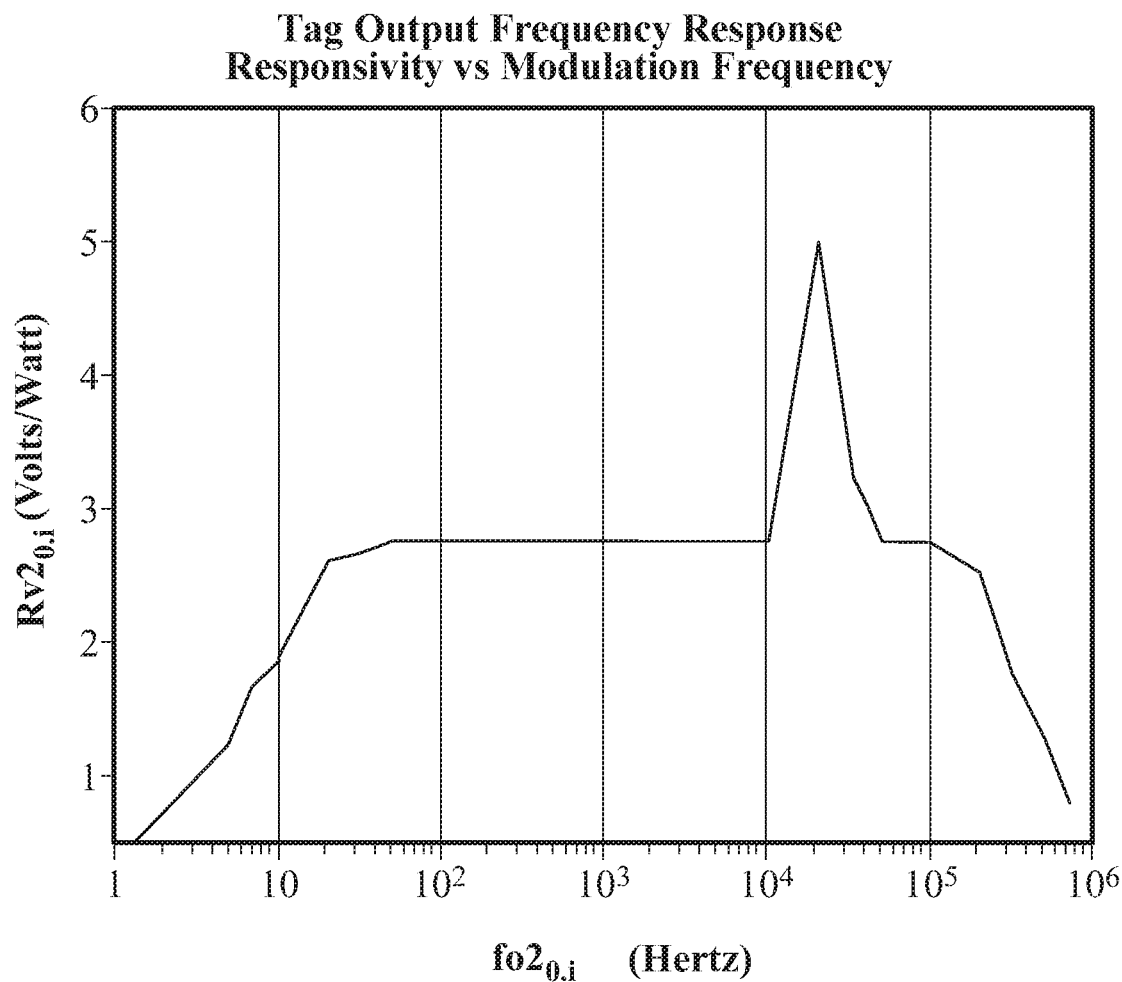

FIGS. 7a and 7b are graphs which illustrate voltage responsivity of lead lanthanum zirconate titanate (PLZT) pyroelectric demodulators, in accordance with one or more embodiments. The trace in FIG. 7a illustrates the voltage responsivity versus a variation in carrier frequency. The trace in FIG. 7b illustrates the voltage responsivity versus a variation in modulation frequency. FIG. 8 is a table which lists various non-limiting impedance varying sensor types and the respective applications, in accordance with one or more embodiments.

Various embodiments of the present application relate to a passive RFID tag which is "on" at all times so that such passive RFID tag can provide unlimited state-of-health monitoring without being limited by the lifetime of a battery. In one or more embodiments, the passive RFID tag can be embedded as a permanent part of a structure, for applications in which access is impractical after initial emplacement. An example can be a pressure sensor embedded in a contact lens which continuously measures intraocular pressure of an eye. Moreover, in at least one embodiment, the range of the passive RFID tags keeps radio frequency emissions below FCC limits, thereby allowing localized operation without causing interference to other nearby electronics.

FIG. 9 is a schematic view of a communication device 900 in accordance with one or more embodiments. Communication device 900 is similar to communication device 100 (FIG. 1). Communication device 900 includes a sensor 905 coupled to an input antenna 910. Demodulator 915 is then coupled to an output antenna 920. Sensor 905 forms a part of demodulator 915 by replacing a fixed resistor normally used in a demodulator by an impedance varying sensor.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A transceiver device comprising:
   an input antenna adapted to receive an interrogation signal comprising a carrier frequency modulated at a modulation frequency, wherein the modulation frequency is less than the carrier frequency;
   a sensor coupled to the input antenna, the sensor adapted to vary its impedance in accordance with a low frequency input, the sensor thereby generating a low frequency signal, wherein a frequency of the low frequency input is less than the modulation frequency;
   a demodulator coupled to the sensor, the demodulator adapted to demodulate the low frequency signal relative to the carrier frequency, the demodulator thereby generating a response signal comprising the modulation frequency modulated by the low frequency signal, wherein a frequency response of the demodulator is less than the carrier frequency, and wherein the frequency response of the demodulator is greater than the modulation frequency; and
   an output antenna coupled to the demodulator, the output antenna adapted to transmit the response signal.

2. The transceiver device of claim 1, wherein the modulation frequency is in a radio frequency range.

3. The transceiver device of claim 1,
   wherein the input antenna is coupled to the demodulator.

4. The transceiver device of claim 1, wherein the input antenna includes the output antenna.

5. The transceiver device of claim 1, further comprising a bandpass filter coupled to the input antenna and the sensor, the band pass filter adapted to pass the modulation frequency.

6. The transceiver device of claim 1, wherein the sensor measures a physical attribute.

7. The transceiver device of claim 6, wherein the physical attribute is one of position, velocity, acceleration, pressure, temperature, humidity, sugar content, heart rate, and blood oxygen.

8. The transceiver device of claim 1, wherein the sensor includes an impedance varying sensor connected with a resistor in series or in parallel.

9. The transceiver device of claim 8, wherein the impedance varying sensor is one of a button mechanical switch, a magnetic-activated switch, resistance strain gage, a resistance thermometer, a piezoelectric pressure sensor, a thermocouple thermometer, a diode impedance sensor, and a photocell.

10. The transceiver device of claim 1, further comprising a low pass filter coupled to the demodulator, the low pass filter adapted to filter out at least a portion of the carrier frequency from the response signal.

11. The transceiver device of claim 1, wherein the demodulator includes one of a pyroelectric demodulator, a piezoelectric demodulator, and a detector diode.

12. The transceiver device of claim 1, wherein the demodulator comprises one of lead zirconate titanate (PZT), lead lanthanum zirconate titanate (PLZT), triglycine sulfate (TGS), lithium tantalate ($LiTaO_3$), lithium niobite ($LiNbO_3$), gallium nitride (GaN), and barium titanate ($BaTiO_3$).

13. The transceiver device of claim 1, wherein the demodulator comprises a pyroelectric demodulator, wherein the pyroelectric demodulator includes:
   a second layer over a silicon substrate, wherein the second layer comprises silicon;
   a third layer over the second layer, wherein the third layer comprises at least one of zinc oxide and $TiO_x$;
   a first platinum layer over the third layer;
   a fifth layer over the first platinum layer;
   a seventh layer over the first platinum layer;
   an eighth layer over the seventh layer;
   a third platinum layer over the eighth layer; and
   an eleventh layer over the third platinum layer.

14. The transceiver device of claim 13, wherein the fifth layer comprises lead zirconate titanate (PZT) or lead lanthanum zirconate titanate (PLZT).

15. The transceiver device of claim 13, further comprising, a second platinum layer over the fifth layer.

16. The transceiver device of claim 13, wherein the seventh layer comprises silicon or silicon dioxide.

17. The transceiver device of claim 13, wherein the eighth layer comprises tantalum or tantalum nitride.

18. The transceiver device of claim 13, wherein the eleventh layer comprises at least one of gold, nickel, and titanium.

19. A transceiver device comprising:
   a sensor adapted to receive an interrogation signal comprising a carrier frequency modulated at a modulation frequency, wherein the modulation frequency is less than the carrier frequency, the sensor also adapted to vary its impedance in accordance with a low frequency input, the sensor thereby generating a low frequency signal, wherein a frequency of the low frequency input is less than the modulation frequency; and
   a demodulator coupled to the sensor, the demodulator adapted to demodulate the low frequency signal relative to the carrier frequency, the demodulator thereby generating a response signal comprising the modulation frequency modulated by the low frequency signal, wherein a frequency response of the demodulator is less than the carrier frequency, and wherein the frequency response of the demodulator is greater than the modulation frequency; and
   an output antenna coupled to the demodulator, the output antenna adapted to transmit the response signal.

20. A method for transceiving, the method comprising the steps of:
   receiving an interrogation signal including a carrier frequency modulated at a modulation frequency, wherein the modulation frequency is less than the carrier frequency;

receiving a low frequency input, wherein a frequency of the low frequency input is less than the modulation frequency;

generating a low frequency signal based upon the low frequency input;

modulating the interrogation signal with the low frequency signal;

demodulating the low frequency signal relative to the carrier frequency with a demodulator to thereby generate a response signal, wherein the response signal comprises the modulation frequency modulated by the low frequency signal, wherein a frequency response of the demodulator is less than the carrier frequency, and wherein the frequency response of the demodulator is greater than the modulation frequency; and transmitting the response signal with an output antenna.

* * * * *